US012618894B2

(12) United States Patent
Wu et al.

(10) Patent No.: US 12,618,894 B2
(45) Date of Patent: May 5, 2026

(54) UNIVERSAL SOCKET TEST CARD

(71) Applicant: HEWLETT PACKARD ENTERPRISE DEVELOPMENT LP, Spring, TX (US)

(72) Inventors: Min-Huang Wu, Taipei (TW); Heriberto Castillo Velez, Aguadilla, PR (US)

(73) Assignee: Hewlett Packard Enterprise Development LP, Spring, TX (US)

( * ) Notice: Subject to any disclaimer, the term of this patent is extended or adjusted under 35 U.S.C. 154(b) by 286 days.

(21) Appl. No.: 18/446,717

(22) Filed: Aug. 9, 2023

(65) Prior Publication Data

US 2025/0052806 A1     Feb. 13, 2025

(51) Int. Cl.
*G01R 31/28*        (2006.01)
(52) U.S. Cl.
CPC ................................ *G01R 31/2815* (2013.01)
(58) Field of Classification Search
None
See application file for complete search history.

(56) References Cited

U.S. PATENT DOCUMENTS

| | | | | |
|---|---|---|---|---|
| 6,766,486 | B2 * | 7/2004 | Neeb | G01R 31/318575 |
| | | | | 714/724 |
| 7,327,151 | B2 * | 2/2008 | Kang | G11C 29/56 |
| | | | | 324/762.01 |
| 2024/0288497 | A1 * | 8/2024 | Spica | G01R 31/2834 |

FOREIGN PATENT DOCUMENTS

| | | | | |
|---|---|---|---|---|
| CN | 119470980 | A * | 2/2025 | G01R 31/00 |
| DE | 102024107660 | A1 * | 2/2025 | G01R 31/00 |

OTHER PUBLICATIONS

Translation of DE 102024107660 A1 (Year: 2025).*
Translation of CN 119470980A (Year: 2025).*

* cited by examiner

*Primary Examiner* — Jermele M Hollington
(74) *Attorney, Agent, or Firm* — Dickinson Wright

(57)                ABSTRACT

Systems and methods are provided for testing sockets, such as but not limited to CPU and GPU sockets. Systems and methods disclosed herein utilize a test card that has a test component and an adaptor Printed Circuit Board. The adaptor Printed Circuit Board (PCB) is configured to connect with a corresponding socket type on a motherboard and serves as an interface between the test component and a socket of the corresponding socket type. The test component includes logic that simulates a test function to test the socket. By connecting the test card to a socket using the adaptor PCB, the socket can be tested by simulating the test function on the test card.

20 Claims, 6 Drawing Sheets

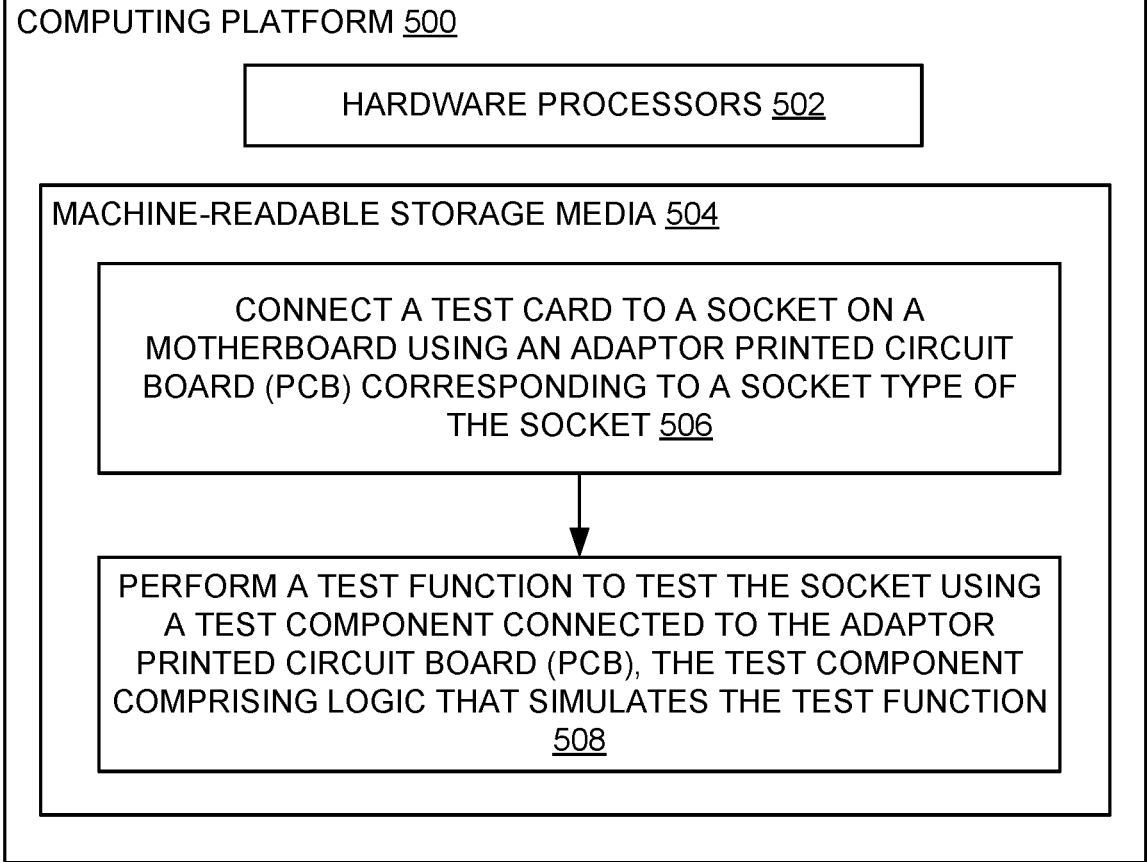

COMPUTING PLATFORM 500

HARDWARE PROCESSORS 502

MACHINE-READABLE STORAGE MEDIA 504

CONNECT A TEST CARD TO A SOCKET ON A MOTHERBOARD USING AN ADAPTOR PRINTED CIRCUIT BOARD (PCB) CORRESPONDING TO A SOCKET TYPE OF THE SOCKET 506

PERFORM A TEST FUNCTION TO TEST THE SOCKET USING A TEST COMPONENT CONNECTED TO THE ADAPTOR PRINTED CIRCUIT BOARD (PCB), THE TEST COMPONENT COMPRISING LOGIC THAT SIMULATES THE TEST FUNCTION 508

FIG. 5

UNIVERSAL SOCKET TEST CARD

BACKGROUND

Motherboards and main logic board (MLB) are printed circuit boards (PCBs) to which main components of a computing device are coupled. Examples of main components include a central processing unit (CPU), graphical processing unit (GPU), memory, etc. To achieve a connection with a CPU, a motherboard/MLB comprises a CPU socket to which the CPU is attached. Similarly, a motherboard/MLB can use a GPU socket to achieve connection with a GPU. There are various methods of testing a sockets, such as, but not limited to, a UPI (Ultra Path Interconnect) Boundary Scan Interconnect (BSI) test, a Structural Test Plus (STP) test, etc.

BRIEF DESCRIPTION OF THE DRAWINGS

The present disclosure, in accordance with one or more various embodiments, is described in detail with reference to the following figures. The figures are provided for purposes of illustration only and merely depict typical or example embodiments.

FIG. 5 is an example computing component that may be used to implement various features of testing a socket in accordance with the implementations disclosed herein.

Figures 1A, 1B:
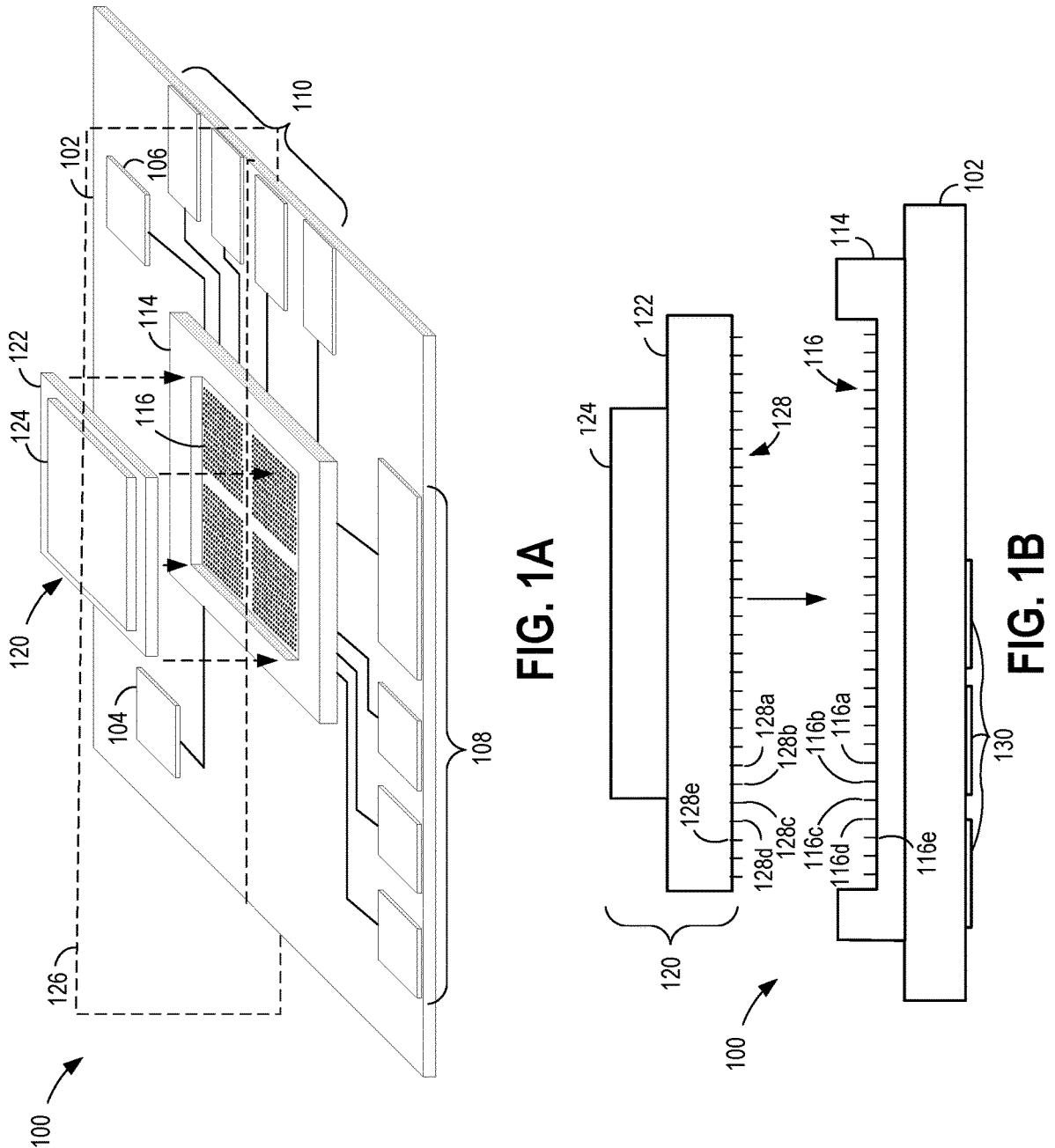
FIG. 1A is a perspective view of an example motherboard comprising a test card according to the presently disclosed technology.
FIG. 1B is a cross-section side view of the motherboard of FIG. 1A taken along a cross-sectional plane shown in FIG. 1A.

The figures are not exhaustive and do not limit the present disclosure to the precise form disclosed.

DETAILED DESCRIPTION

The presently disclosed technology is directed to a test card that comprises universal test component that includes an integrated circuit (IC) having programmable logic provided for simulating a test function and a customized adaptor component, which can be provided as a printed circuit board (PCB). The programmable logic can be provided as a FPGA/CPLD IC (Field Programmable Gate Array Integrated Circuit/Complex Programmable Logic Device Integrated Circuit) programmed to execute a desired test function. The test component can be universal, such that the test component can simulate a test function of any socket type via the adaptor component, which is customized so to plug into and/or interface, through establishment of an electrical connection, with a socket of a socket type corresponding to the adaptor component. More particularly, each instance of a customized adaptor component is configured to interface with a particular socket type.

As alluded to above, motherboards comprise sockets used to attach processing units, such as a CPUs and GPUs. Sockets are generally designed to be specific to the processing unit. That is, for example, a motherboard couples to a particular CPU using a particular CPU socket type that corresponds to the particular CPU. Different CPUs have different sizes, structures, and pin configurations. Therefore, the different CPU socket types have different sizes, structures, and pin configurations to accommodate the different CPUs. As a result, the different CPU socket types are not interchangeable among different CPUs; a particular CPU must mate with a corresponding CPU socket type. Similarly, a motherboard attaches to a particular GPU using a particular GPU socket type that corresponds to the particular GPU. As used herein, "socket" will be understood to refer to CPU sockets, GPU sockets, and the like, unless otherwise explicitly stated or in the context of description.

As noted above, there are various ways of testing a socket on a motherboard. Examples of test methods include, but are not limited to, a UBS test, a UPI BSI test, a STP test, etc. The logic for performing these tests can be embodied in distinct test modules. Test modules are provided with logic programmed that, when executed, tests certain capabilities of sockets or CPUs abilities to perform the certain capabilities. For example, one test module may be programmed to execute a UPI BSI test method, which simulates standard IEEE 1149.1/6 boundary scan capability and tests the socket's capabilities with respect to the IEEE 1149.1/6 boundary scan capability. A different test module may be programmed to execute a STP test method, which only applies to CPU sockets manufactured by Intel® and only works with specific Intel® test controller equipment.

With conventional systems and methods, in order to test a socket, it is necessary to purchase actual, real CPUs (or GPUs) from the different CPU manufacturers (e.g., Intel®, AMD, etc.) or GPU manufacturers (e.g., Nvidia®). The CPU (or GPU) manufacturer adds test modules to the actual, real CPU (or GPU) as logic for performing each distinct test method. Sockets are then tested using the actual, real CPUs (or GPUs) by executing the on-chip test modules.

However, there are several short comings to these conventional approaches. Some CPU sockets experienced issues with UPI BSI tests and were unable to perform the test properly. As a result, extra serial vector format (SVF) files, which are configuration files that define the test function, need to be programmed into the CPU prior to testing, which can result in increased test time by 5 to 10 minutes per socket under test. In some cases, configuration files needed to be program, the test executed, and the configuration files refined in order to retest the motherboard. This can result in retesting of the motherboard up to 3 times more than a normal, expected test. Further, the UPI BSI test can be unstable, and there often are false failures that can also require re-testing. In some cases, the instability of UPI BSI test and longer test cycles results in the test not being preforming at all in order to meet development cycle deadlines. These and other factors often lead to delays in test times for the UPI BSI tests, which delays downstream processes due to a need to locate and report any issues to manufacturers so that the manufacture can fix the issue and proceed to the next phase of development. Additionally, these and other factors can often lead to increased costs for testing CPU sockets. Further, the need to purchase real CPUs in order to test the CPU sockets can drive up costs and can also lead to an increase in the time it takes to test a CPU socket.

The presently disclosed technology overcomes the above short-comings by providing a test card that includes an adaptor component configured to connect with a particular socket type corresponding to the adaptor component and serve as an interface between a universal test component and a socket of the corresponding socket type. The test component carries logic that simulates a test function for testing the socket. In some examples, the socket may be CPU socket, while in others the socket may be a GPU socket or the like. The adaptor component may be provided as a PCB, while the test component can provided as a FGPA IC or a CPLD IC programmed with the logic that simulates the test function. The test function can be one of a UBS test, BSI test, UPI BSI test, and the like. The adaptor component can be configured to connect with the corresponding socket type by having a connector (e.g., pin configuration) that corresponds to (e.g., match with or otherwise be complimentary to) a connector (e.g., pin configuration) of the corresponding socket type. The test component can be a universal test module that is configured to interface with any number of CPU and/or GPU socket types.

In an illustrative example, the test card may be a CPU socket test card that includes test component programmed to simulate a Universal Boundary Scan (UBS) and an adaptor component configured to interface/connect with a particular CPU socket type corresponding to the adaptor component. The UBS module is able to test a CPU socket of a corresponding CPU socket type using the adaptor component plug in to a CPU socket of the corresponding CPU socket type so to establish a connection (e.g., interface with) between the test component and the CPU socket. By virtue of the features of the present invention, CPU socket test cards can be provided for testing various CPU sockets, and therefore, the need to purchase real CPUs in order to test the CPU sockets can be avoided. Furthermore, due to the CPU socket test cards of the present invention, the cost and/or time for testing CPU sockets can be reduced.

FIG. 1A is a perspective view of an example motherboard 100 in which the presently disclosed technology can be implemented. FIG. 1B is a cross-section side view of the motherboard 100 taken along the cross-sectional plane 126 shown in FIG. 1A. The motherboard 100 can include a PCB 102. A plurality of components can be electrically coupled to the PCB 102. The examples of components include a BIOS chip 104, a backup battery 106, peripheral connectors 108, such as universal serial buses (USBs), serial ports, parallel ports, audio ports, ethernet ports, etc., and memory 110, among others.

The motherboard can also include at least one socket 114. Some example motherboards include two or more sockets 114, and in some cases four sockets 114. For illustrative purposes, one socket 114 is shown in FIG. 1, but additional sockets may be included which can be substantively similar to socket 114 as described herein.

The socket 114 can be adapted to receive a processing unit (not shown) that corresponds to the socket and to connect the processing unit to one or more of components 104-112 or any other components not listed via PCB 102. For example, the PCB 102 can comprise electrical connections in the form of electrical traces between socket 114 and components 104-112 and/or other components not listed, as well as between components. The socket 114 can be coupled to the traces through any suitable means, such as soldering, compression, and the like.

The socket 114 can be designed to receive a processing unit. For example, the socket 114 can include a vertical connector comprising a plurality of electrical connectors 116. The socket 114 may have a particular size, structure, and electrical connector configuration that is dependent on the socket type implemented as the socket 114 (e.g., dependent on the particular processing unit the socket 114 is configured to interface with). In one example, the electrical connectors 116 can comprise a plurality of pins, such as a land grid array (LGA). That is, the socket 114 may be a LGA type socket. In another example, the electrical connectors 116 can comprise a plurality of through holes for receiving a plurality of pins, such as a pin grid array (PGA) formed on the mounting side of a processing unit. That is, the socket 114 may be a PGA type socket. In yet another example, the socket 114 may be implemented as a ball grid array (BGA) type socket. In any case, the number and configuration of the electrical connectors 116 is dependent is dependent on the socket type implemented as the socket 114. The processing unit can be coupled to the socket 114 through any suitable means, such as soldering, compression, and the like.

The processing unit may be a central processing unit (CPU) or a graphical processing unit (GPU). In the case of a CPU, the PCB 102 may comprise a GPU as well (not shown in FIG. 1). Similarly, in the case of a GPU, the PCB 102 may comprise a CPU. The processing unit can include a single processor or a plurality of processors. The processor(s) can include any suitable type of processor, such as but not limited to, processors provided by Intel®, AMD, etc.

Motherboard 100 also comprises a test card 120 that can be received by the socket 114. The test card 120 comprises a test component 124 and an adaptor 122 (sometimes referred to herein as an "adaptor PCB" or an "adaptor component"). The test component 124 (sometimes referred to herein as a "test module") may be an integrated circuit (IC) having programmable logic provided for simulating a test function. For example, the test component 124 may comprise programmable logic for simulating one or more of a UBS test, BSI test, STP test, UPI BSI test, and the like. The test component 124 is able to test a socket of any type. The programmable logic can be provided as a FPGA or a CPLD IC programmed to execute the embodied test function.

The adaptor 122 can be a customized adaptor PCB that can be inserted into socket 114 to interface or otherwise connect to the socket 114. The adaptor 122 is configured according to the socket type implemented as socket 114. For example, the adaptor 122 can comprise a plurality of electrical connectors 128 complimentary to the plurality of electrical connectors 116 of socket 114. For example, a socket mounting surface of the adaptor 122 can comprise a plurality of through holes for receiving a plurality of pins of socket 114 in the case of a LGA socket. As another example, the socket mounting surface of the adaptor 122 can comprise a plurality of pins that can be received by a plurality of through holes of socket 114 in the case of a PGA socket type. In any case, the adaptor 122 comprises an electrical connector configuration that corresponds to (e.g., match with or otherwise be complimentary to) a complimentary electrical connector configuration of a corresponding socket type. As described above, different socket types can have different electrical connector configurations, and the test component 124 comprises an electrical connector configuration that corresponds to the electrical connector configuration of the socket 114. In some examples, each of the plurality of electrical connectors 128 is complimentary to a connect of the plurality of electrical connectors 116, while in other examples, a subset of plurality of electrical connectors 128 may be complimentary (e.g., not all of plurality of electrical connectors 128 need by utilized depending on the socket type implemented as socket 114). Accordingly, the test card 120 can use the adaptor 122 so to plug into and/or interface, through an electrical connection established between electrical connectors 116 and 128, with the socket 114 corresponding to the adaptor 122 so to connect the test component 124 to the socket 114 for simulating the test function embodied on the test component.

The test card 120 can therefore function as a "dummy" module for testing purposes. The "dummy" module can replace a real CPU or GPU along with the CPU/GPUs vendor dependencies while increasing the overall test coverage. That is, test card 120 comprising test component 124 having a programmed IC for simulating a test function (such as UBS) can function as a dummy module that is interfaced with the socket 114 via the adaptor 122. The test card 120 is attached to the adaptor 122, which is inserted into the socket 114 of a particular socket type corresponding to the adaptor 122. In this way, the test card 120 can be utilized to test the motherboard 100, for example, by simulating BS test functions to test socket 114, e.g., to determine whether the socket 114 has any open or short pins. As such, real processing units (e.g., CPUs/GPUs) need not be purchased in order to test sockets.

As alluded to above, the adaptor 122 is customized according to a socket type implemented as socket 114. When a number of motherboards are test, each having a socket of a different socket type, individual adaptors 122 can be provided that are customized according to the socket types. Yet, the test component 124 can be universally utilized for testing by coupling to each adaptor 122 using any means or method to connect adaptor 122 to test component 124. For example, one customized adaptor 122 can be structured to fit one type of socket (e.g., Intel CPU sockets), and another customized adaptor 122 can be structured to fit another type of socket (e.g., AMD CPU sockets). To test perform a BS test on both example sockets, identical test components 124 can be attached to each adaptor 122. In some cases, identical instances of the test component 124 (e.g., identical in structure, configuration, logic, etc.) can be used for testing each socket. In an example implementation, the adaptor 122 can be removable from the test component 124. In this case, the exact same test component 124 can be interchangeably switched between adaptors 122. In some implementations, power supply to the test component 124 may be supplied from a power supply of the motherboard. However, power supplied to test component 124 is not limited as being from motherboard 100, and can be supplied from an external power source(s), for example, external power supply.

Example types of sockets include, but are not limited to, Intel CPU socket S adapted to interface with the Sapphire Rapids CPUs offered by Intel; Intel CPU socket R adapted to interface with the Rocket Lake CPUs offered by Intel; AMD CPU socket G adapted to interface with Genoa CPUs offered by AMD; Nvidia GPU socket X adapted to interface with Redstone GPUs offered by Nvidia; among others. Other example types may include sockets that utilize LGA, PGA, or BGA connectors of varying connector configurations. A customized adaptor 122 may be provided for each socket type and connected to a test component 124 for simulating test functions on each respective socket type, as described above. The test card 120 may be referred to as a CPU test card (or CPU socket test card) in the case of a CPU socket. In another example, the test card 120 may be referred to as a GPU test card (or GPU socket test card) in the case of a GPU socket.

As noted above, by virtue of the features of the presently disclosed technology, the overall test coverage can be improved. One reason is because with the test component 124 as a dummy module, power and ground pins can be tested, which is not the case with a real processing. Moreover, a heat sink is not required on fixtures for the test component 124 implemented as a CPLD because CPLD doesn't generate high heat, thus increasing fixture size, complexity, and costs due to inclusion of a heat sink is avoided. Accordingly, by virtue of the test card 120, fixture design can be made less complex.

It is to be understood that the illustration of FIG. 1 is not intended to indicate that the motherboard 100 is to include all of the components shown in FIG. 1 in every case. Further, any number of additional components can be included within the motherboard 100, depending on the details of the specific implementation.

In an illustrative example implementation of a server motherboard BSI test, where socket 114 is a CPU socket 114, the electrical connectors 116 may include a plurality of Joint Test Action Group (JTAG) pins that can be connected to corresponding JTAG ports included as part of plurality of electrical connectors 128 when test card 120 is pressed to contact CPU socket 114. As an illustrative example, electrical connectors 116 may comprise Test Data In (TDI) pin 116a, Test Data Out (TDO) pin 116b, Test Clock (TCK) pin 116c, Test Mode Select (TMS) pin 116d, and Test Reset (TRST) pin 116e and plurality of electrical connectors 128 may comprising corresponding Test Data In (TDI) port 128a, Test Data Out (TDO) port 128b, Test Clock (TCK) port 128c, Test Mode Select (TMS) port 128d, and Test Reset (TRST) port 128e. The JTAG pins 116a-116e of the CPU socket 114 can also be connected to metal JTAG test pads 130 provided on the bottom surface of the motherboard 100. The test pads 130 are not necessarily at fixed location on bottom side of across implementations of motherboard 100 due to that every motherboard has different circuit design and part placements, but test pads 130 may generally be positioned to coincide with the bottom side location of socket 114.

To perform the BSI test, the motherboard 100 can be placed on a BSI test fixture (not shown) installed with test probes corresponding and connected to each of the JTAG test pads 130. The test probes can also be connected to a computing platform, such as, for example, computer system 600 of FIG. 6. When power is supplied to motherboard 100, the computing platform can be controlled to send boundary scan commands and signals to test pads 130 and JTAG pins 116a-116e via the test probes and ultimately to the test card 120 through JTAG ports 128a-128e to start the BSI test simulated by the test card 120.

The test card 120 can simulate the BSI test (e.g., the test function in this example) by generating boundary scan 1149.1/1149.6 signals (also referred to as scan signals) and applying these signals to electrical connectors 116. Certain electrical connectors 128 can be connected to electrical traces on the motherboard 100, which are connected to components 104-112. For example, each of a first subset of electrical connectors 128 may be connected to a memory 110 via a corresponding electrical trace and each of a second subset of electrical connectors 128 may be connected to a peripheral connectors 108 via a corresponding electrical trace, as shown in FIG. 1A. The components of motherboard 100, such as memory 110 and peripheral connectors 108, may each include a customized test card inserted into the component for simulating the BSI test. The test card may be similar to test component 124 disclosed herein comprising programmable logic for simulating a test function (e.g., a BSI test in this example). As such, boundary scan 1149.1/ 1149.6 signals applied to a given electrical connector 128 can be supplied to a test card inserted into a component (e.g., peripheral connectors 108, memory 110, etc.) via a corresponding electrical trace and interconnection between a corresponding electrical connector 116 and electrical connector 128. The computing platform can then monitor the boundary scan 1149.1/1149.6 signals supplied to each component of motherboard 100 to determine a pass or fail for each electrical connectors 116 of the socket 114 that is utilized by the motherboard 100.

As another example, test card 120 can also receive boundary scan 1149.1/1149.6 signals that are generated at test cards of each components of motherboard 100 (e.g., peripheral connectors 108, memory 110, etc.) through the interconnection between electrical connectors 116 and electrical connectors 128. The received boundary scan 1149.1/1149.6 signals can be processed by the computing platform, through the JTAG ports 127a-128e and JTAG pins 116a-116e, to determine a pass or fail for each electrical connectors 116 of the socket 114 that is utilized by the motherboard 100.

Through the above illustrative examples, all electrical connectors 116 of socket 114 that is utilized by the motherboard 100 can be tested by test card 120. Further, all power and ground connectors 128 of socket 114 can also be by test card 120 through substantially similar methods.

Figure 2:
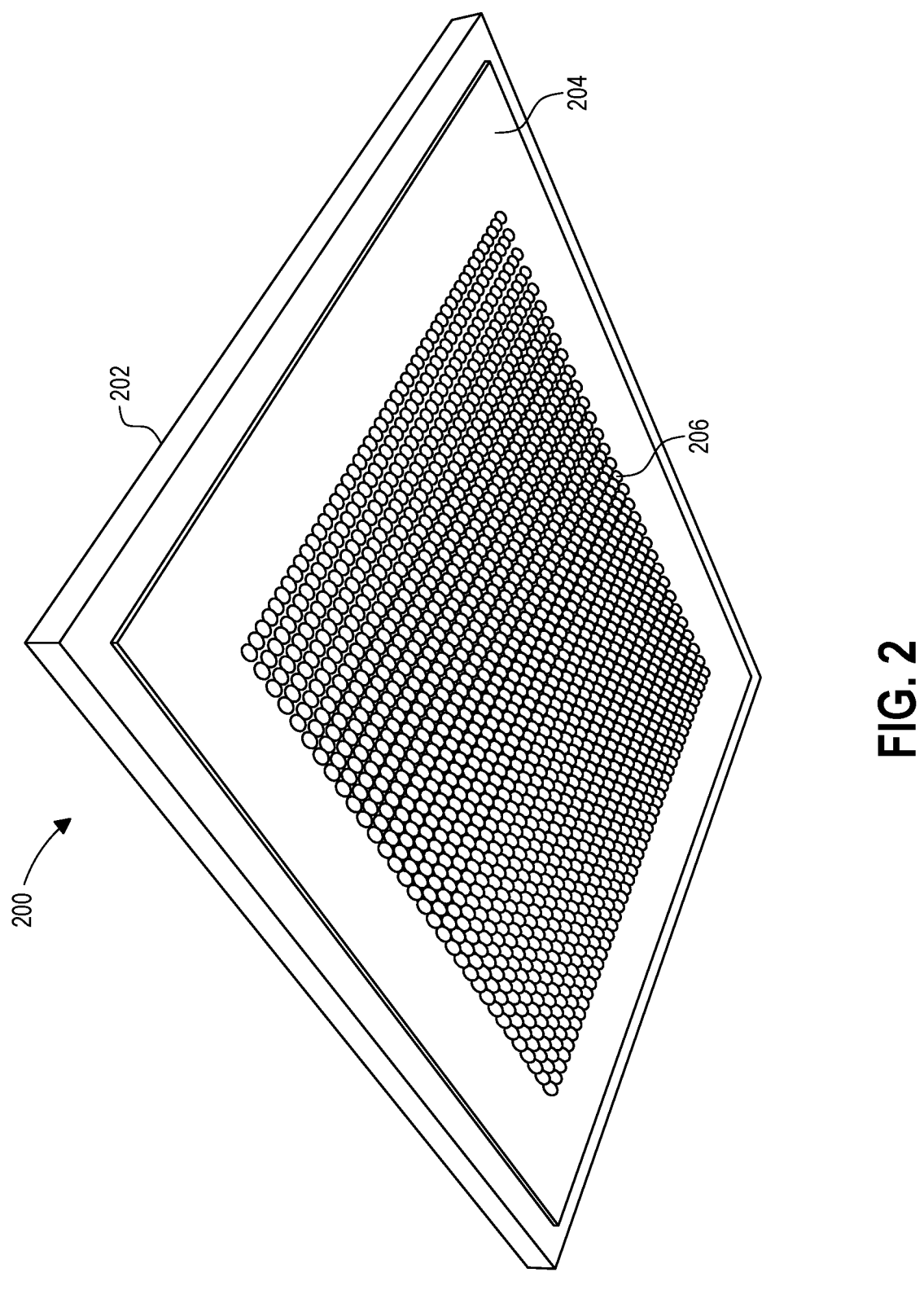
FIG. 2 is a perspective view of an example test component according to the presently disclosed technology.

FIG. 2 is a perspective view of an example test component 200 according to the presently disclosed technology. Test component 200 may be an example of the test component 124 described above in connection with FIGS. 1A and 1B. As such, the test component 124 include an integrated circuit (IC) having programmable logic provided for simulating a test function. The test component 200 may be universal in that the programmable logic provided thereon can be executed to simulate the embodied test function on any socket type.

Test component 200 comprises a substrate 202 on which the programmable logic is provided. The substrate 202 may comprise a FPGA or a CPLD IC containing logic for simulating a desired test function. The test component 200 comprises a vertical connector 204 provided on an interfacing surface of the substrate 202. The vertical connector 204 is configured to interface with or otherwise form an electrical connection with an adaptor (e.g., adaptor 122 of FIGS. 1A and 1B). The vertical connector 204 comprises a plurality of electrical connectors 206. In one example, the electrical connectors 206 can comprise a plurality of pins, such as a PGA. In another example, the electrical connectors 206 can comprise a plurality of through holes for receiving a plurality of pins, such as a LGA formed on an interfacing surface of a receiving adaptor. In yet another example, the electrical connectors 206 may be implemented as a ball grid array (BGA) type.

Figure 3A:
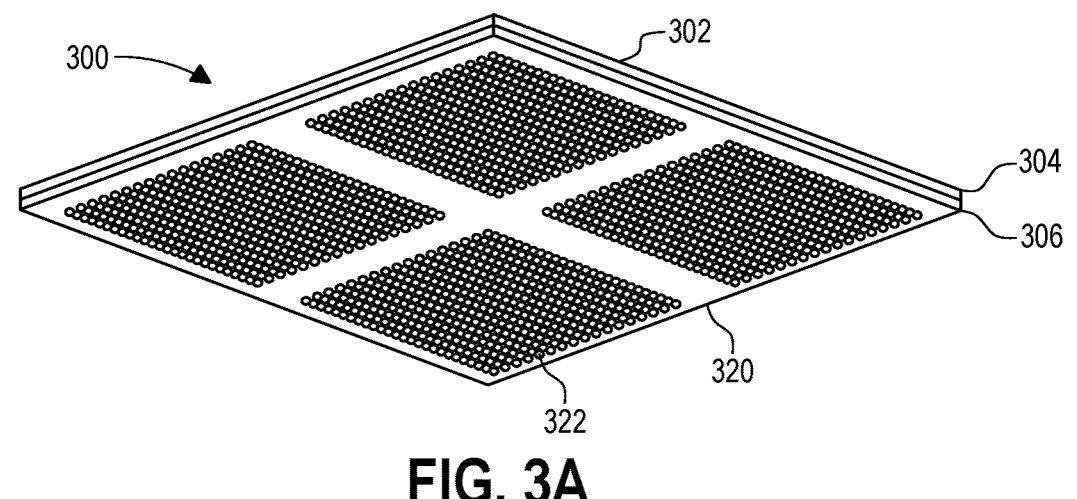
FIGS. 3A-3C are various views of an example adaptor in accordance with an example implementation of the presently disclosed technology.
Figure 3B:
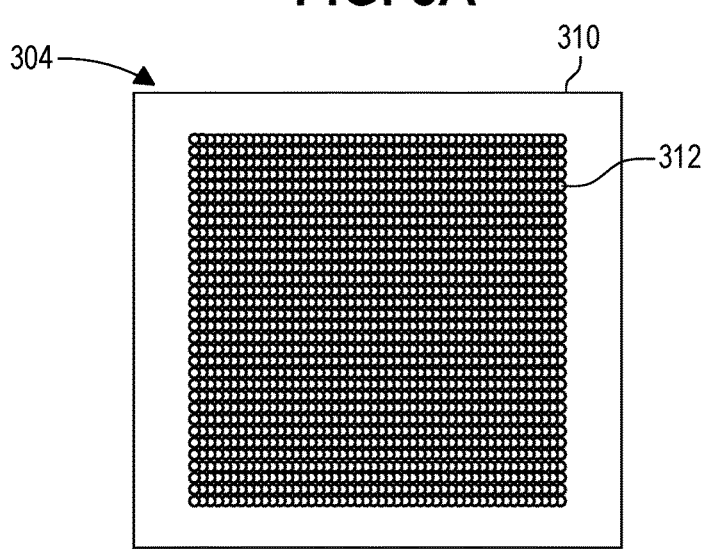
Figure 3C:
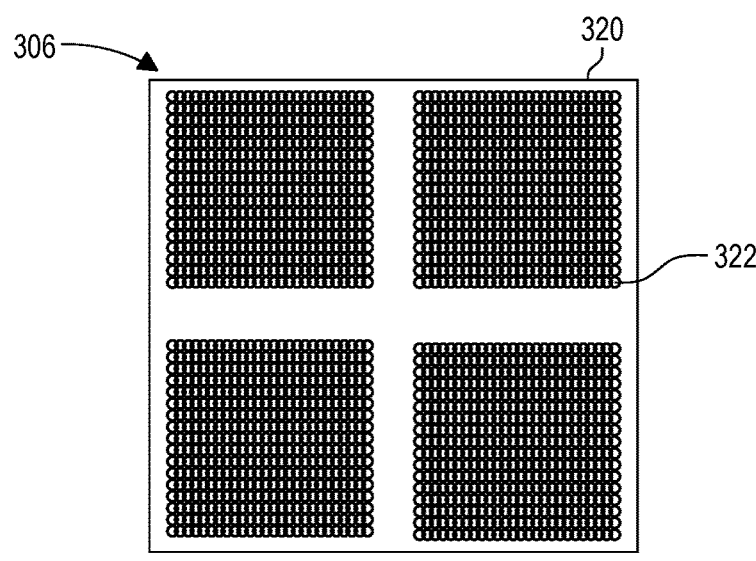

FIGS. 3A-3C are various views of an example adaptor 300 in accordance with an example implementation of the presently disclosed technology. FIG. 3A is a up perspective view of the adaptor 300, FIG. 3B is a top view of the adaptor 300, and FIG. 3C is a bottom view of the adaptor 300.

Adaptor 300 comprises a PCB 302 having an interfacing surface 304. The interfacing surface 304 comprises a vertical connector 310, as shown in FIG. 3B. The vertical connector 310 is configured to interface with or otherwise form an electrical connection with a test component (e.g., test component 124 of FIGS. 1A and 1B and/or test component 200 of FIG. 2). The vertical connector 310 comprises a plurality of electrical connectors 312 that correspond to (e.g., match with or otherwise be complimentary to) electrical connectors of the test component. For example, electrical connectors 312 may correspond to electrical connectors 206 of the test component 200 of FIG. 2. In one example, the electrical connectors 312 can comprise a plurality of pins, such as a LGA. In another example, the electrical connectors 312 can comprise a plurality of through holes for receiving a plurality of pins, such as a PGA formed on an interfacing surface of a receiving adaptor. In yet another example, the electrical connectors 312 may be implemented as a BGA type.

The PCB 302 also comprises a mounting surface 306. The mounting surface 306 comprises a vertical connector 320, as shown in FIG. 3C. The vertical connector 320 is configured to interface with or otherwise form an electrical connection with a socket (e.g., socket 114 of FIGS. 1A and 1B), thereby establishing an electrical connection between the socket and a test component. The vertical connector 320 comprises a plurality of electrical connectors 322 that correspond to (e.g., match with or otherwise be complimentary to) electrical connectors of the socket. For example, electrical connectors 322 may correspond to electrical connectors 116 of the socket 114 of FIGS. 1A and 1B. In one example, the electrical connectors 322 can comprise a plurality of pins, such as PGA. In another example, the electrical connectors 322 can comprise a plurality of through holes for receiving a plurality of pins, such as a LGA of a receiving socket. In yet another example, the electrical connectors 322 may be implemented as a BGA type.

As described above, there are different socket types and adaptors according to the present disclosure are adapted so to correspond to a specific socket type. In the example of FIGS. 3A-3C, the electrical connectors 322 are provided in particular configuration that is specific to the socket to which adaptor 300 is configured to interface with. In this example, adaptor 300 may comprises 6,096 connectors divided into four sub-regions as shown in FIGS. 3A and 3C that interface with 6,096 connectors of a socket. In this case, adaptor 300 may be configured to connect with a AMD CPU socket G.

Adaptor 300 can include a pin mapping of electrical connectors 322 on mounting surface 306 to the electrical connectors 312 on the interfacing surface 304. This mapping may be dependent on socket type. For example, electrical connectors 322 comprises connectors that are complimentary to the socket type to be tested (e.g., all connectors 322 correspond to a connector of the socket or at least all connectors of the socket correspond to a subset of the electrical connectors 322). Each connector electrical connectors 322 can then be mapped to a corresponding electrical connectors 312 on interfacing surface 304 according to the test embodied by a test card for testing the socket. Not all electrical connectors 312 of interfacing surface 304 need by mapped to a electrical connector 322, so long as each electrical connectors 322 that corresponds to a connector of the socket is mapped to an electrical connector 312.

Figure 4A:
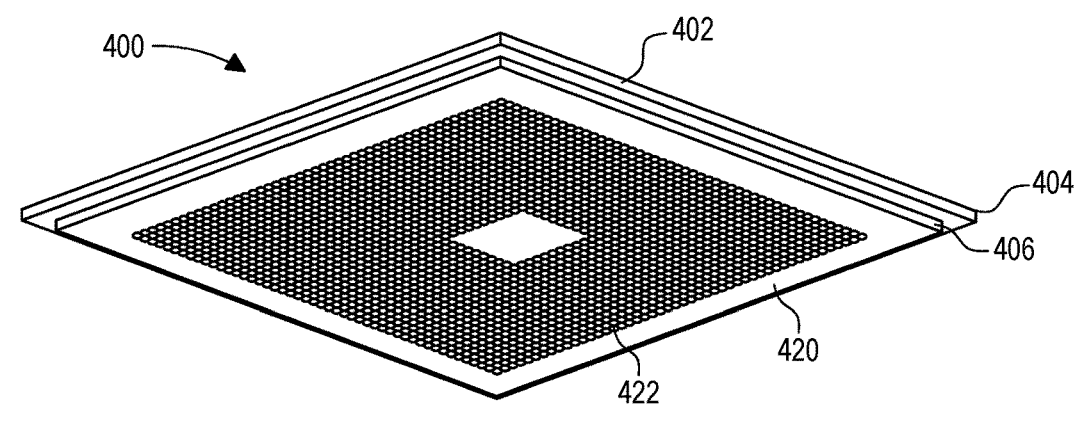
FIGS. 4A-4C are various views of another example adaptor in accordance with an example implementation of the presently disclosed technology.
Figure 4B:
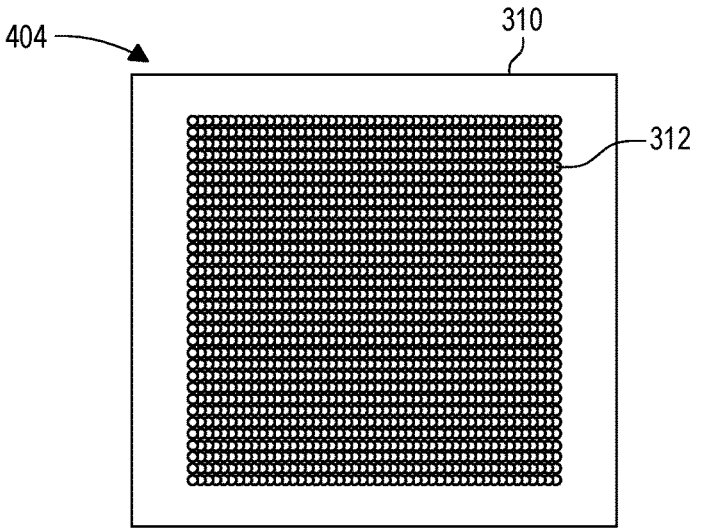
Figure 4C:
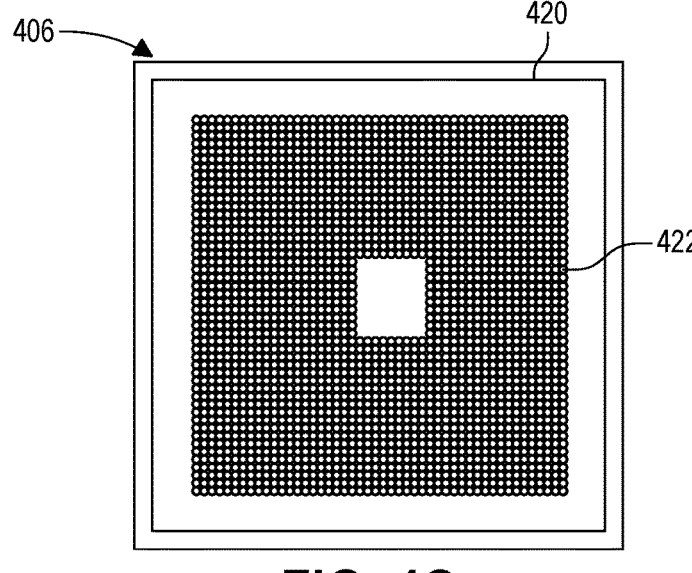

FIGS. 4A-4C are various views of an example adaptor 400 in accordance with an example implementation of the presently disclosed technology. FIG. 4A is a up perspective view of the adaptor 400, FIG. 4B is a top view of the adaptor 400, and FIG. 4C is a bottom view of the adaptor 400.

Adaptor 400 comprises a PCB 402 having a interfacing surface 404. The interfacing surface 404 comprises a vertical connector 310, as shown in FIG. 4B. The vertical connector 310 is configured to interface with or otherwise form an electrical connection with a test component (e.g., test component 124 of FIGS. 1A and 1B and/or test component 200 of FIG. 2). As implied above, adaptor 400 may comprise a vertical connector that is identical to the vertical connector included on adaptor 300 of FIGS. 3A-3C. As a result, the same test component can be interchangeably attached to each adaptor, regardless of the socket type or motherboard under test. Accordingly, each adaptor can be connected to a universal test component.

Returning to FIGS. 4A-4C, PCB 402 also comprises a mounting surface 406. The mounting surface 406 comprises a vertical connector 420, as shown in FIG. 4C. The vertical connector 420 is configured to interface with or otherwise form an electrical connection with a socket (e.g., socket 114 of FIGS. 1A and 1B), thereby establishing an electrical connection between the socket and a test component. The vertical connector 420 comprises a plurality of electrical connectors 422 that correspond to (e.g., match with or otherwise be complimentary to) electrical connectors of the socket. For example, electrical connectors 422 may correspond to electrical connectors 116 of the socket 114 of FIGS. 1A and 1B. In one example, the electrical connectors 422 can comprise a plurality of pins, such as PGA. In another example, the electrical connectors 422 can comprise a plurality of through holes for receiving a plurality of pins, such as a LGA of a receiving socket. In yet another example, the electrical connectors 422 may be implemented as a BGA type.

As described above, there are different socket types and adaptors according to the present disclosure are adapted so to correspond to a specific socket type. In the example of FIGS. 4A-4C, the electrical connectors 422 are provided in particular configuration that is specific to the socket to which adaptor 400 is configured to interface with. In this example, adaptor 400 may comprise 4,766 connectors, arranged as shown in FIG. 4C, to interface with 4,766 pins of a socket. In this case, adaptor 400 may be configured to connect with an Intel CPU socket S. Additionally, as described above, adaptor 400 can comprise a mapping of each electrical connector 422, corresponding to a connector of a socket to be test, to an electrical connector 412.

FIG. 5 illustrates an example computing component that may be used to implement a test function of a socket in accordance with various embodiments. Referring now to FIG. 5, computing component 500 may be, for example, a server computer, a controller, or any other similar computing component capable of processing data. In the example implementation of FIG. 5, the computing component 500 includes a hardware processor 502, and machine-readable storage medium for 504.

Hardware processor 502 may be one or more central processing units (CPUs), semiconductor-based micropro-cessors, and/or other hardware devices suitable for retrieval and execution of instructions stored in machine-readable storage medium 504. Hardware processor 502 may fetch, decode, and execute instructions, such as instructions 506-508, to control processes or operations for testing a socket. As an alternative or in addition to retrieving and executing instructions, hardware processor 502 may include one or more electronic circuits that include electronic components for performing the functionality of one or more instructions, such as a field programmable gate array (FPGA), application specific integrated circuit (ASIC), or other electronic cir-cuits.

A machine-readable storage medium, such as machine-readable storage medium 504, may be any electronic, mag-netic, optical, or other physical storage device that contains or stores executable instructions. Thus, machine-readable storage medium 504 may be, for example, Random Access Memory (RAM), non-volatile RAM (NVRAM), an Electri-cally Erasable Programmable Read-Only Memory (EE-PROM), a storage device, an optical disc, and the like. In some embodiments, machine-readable storage medium 504 may be a non-transitory storage medium, where the term "non-transitory" does not encompass transitory propagating signals. As described in detail below, machine-readable storage medium 504 may be encoded with executable instructions, for example, instructions 506-508.

Hardware processor 502 may execute instruction 506 to connect a test card to a socket on a motherboard using an adaptor Printed Circuit Board (PCB) corresponding to a socket type of the socket. Examples of the test card and adaptor are provided above in connection with FIGS. 1A-4.

Hardware processor 502 may execute instruction 508 to perform a test function to test the socket using a test component connected to the adaptor Printed Circuit Board (PCB). As discussed above in connection with FIGS. 1A-4, the test component comprises logic that simulates the test function which can be executed to test the socket.

Figure 6:
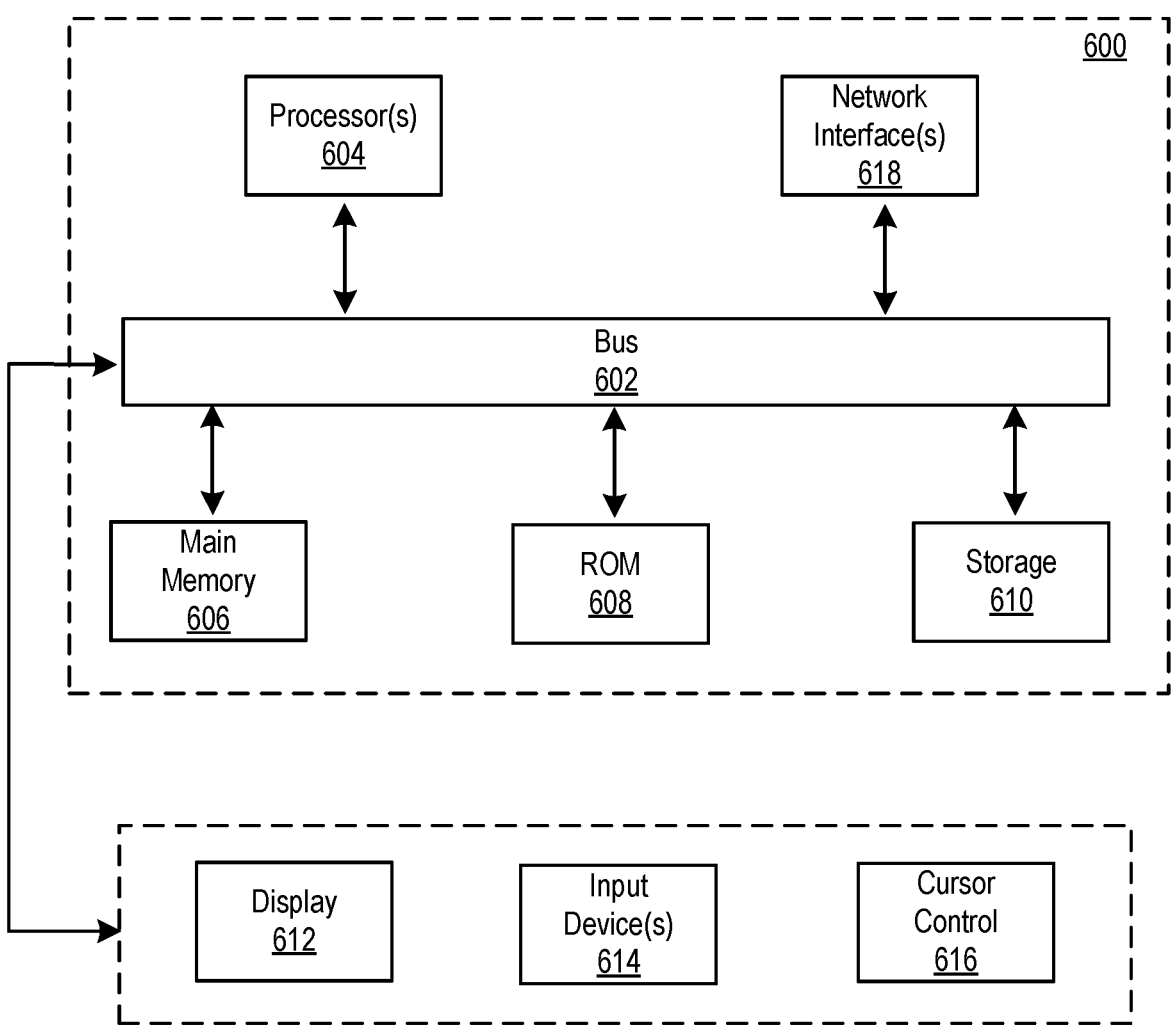
FIG. 6 is an example computer system that may be used to implement various features of socket testing of the present disclosure.

FIG. 6 depicts a block diagram of an example computer system 600 in which various examples described herein may be implemented. The computer system 600 includes a bus 602 or other communication mechanism for communicating information, one or more hardware processors 604 coupled with bus 602 for processing information. Hardware proces-sor(s) 604 may be, for example, one or more general purpose microprocessors.

The computer system 600 also includes a main memory 606, such as a random access memory (RAM), cache and/or other dynamic storage devices, coupled to bus 602 for storing information and instructions to be executed by processor 604. Main memory 606 also may be used for storing temporary variables or other intermediate informa-tion during execution of instructions to be executed by processor 604. Such instructions, when stored in storage media accessible to processor 604, render computer system 600 into a special-purpose machine that is customized to perform the operations specified in the instructions. As an example, test card 120 may be coupled to computer system 600 via communication interface 618, and processor 606 can be configured to execute instructions stored in main memory 606 to determine pass or fail of a socket in which the test card 120 is received based on test or scan signals generated and/or received by the test card 120.

The computer system 600 further includes a read only memory (ROM) 608 or other static storage device coupled to bus 602 for storing static information and instructions for processor 604. A storage device 610, such as a magnetic disk, optical disk, or USB thumb drive (Flash drive), etc., is provided and coupled to bus 602 for storing information and instructions.

The computer system 600 may be coupled via bus 602 to a display 612, such as a liquid crystal display (LCD) (or touch screen), for displaying information to a computer user. An input device 614, including alphanumeric and other keys, is coupled to bus 602 for communicating information and command selections to processor 604. Another type of user input device is cursor control 616, such as a mouse, a trackball, or cursor direction keys for communicating direc-tion information and command selections to processor 604 and for controlling cursor movement on display 612. In some embodiments, the same direction information and command selections as cursor control may be implemented via receiving touches on a touch screen without a cursor.

The computing system 600 may include a user interface module to implement a GUI that may be stored in a mass storage device as executable software codes that are executed by the computing device(s). This and other mod-ules may include, by way of example, components, such as software components, object-oriented software components, class components and task components, processes, functions, attributes, procedures, subroutines, segments of program code, drivers, firmware, microcode, circuitry, data, databases, data structures, tables, arrays, and variables.

In general, the word "component," "engine," "system," "database," data store," and the like, as used herein, can refer to logic embodied in hardware or firmware, or to a collection of software instructions, possibly having entry and exit points, written in a programming language, such as, for example, Java, C or C++. A software component may be compiled and linked into an executable program, installed in a dynamic link library, or may be written in an interpreted programming language such as, for example, BASIC, Perl, or Python. It will be appreciated that software components may be callable from other components or from themselves, and/or may be invoked in response to detected events or interrupts. Software components configured for execution on computing devices may be provided on a computer readable medium, such as a compact disc, digital video disc, flash drive, magnetic disc, or any other tangible medium, or as a digital download (and may be originally stored in a compressed or installable format that requires installation, decompression or decryption prior to execution). Such software code may be stored, partially or fully, on a memory device of the executing computing device, for execution by the computing device. Software instructions may be embedded in firmware, such as an EPROM. It will be further appreciated that hardware components may be comprised of connected logic units, such as gates and flip-flops, and/or may be comprised of programmable units, such as programmable gate arrays or processors.

The computer system 600 may implement the techniques described herein using customized hard-wired logic, one or more ASICs or FPGAs, firmware and/or program logic which in combination with the computer system causes or programs computer system 600 to be a special-purpose machine. According to one embodiment, the techniques herein are performed by computer system 600 in response to processor(s) 604 executing one or more sequences of one or more instructions contained in main memory 606. Such instructions may be read into main memory 606 from another storage medium, such as storage device 610. Execution of the sequences of instructions contained in main memory 606 causes processor(s) 604 to perform the process steps described herein. In alternative embodiments, hard-wired circuitry may be used in place of or in combination with software instructions.

The term "non-transitory media," and similar terms, as used herein refers to any media that store data and/or instructions that cause a machine to operate in a specific fashion. Such non-transitory media may comprise non-volatile media and/or volatile media. Non-volatile media includes, for example, optical or magnetic disks, such as storage device 610. Volatile media includes dynamic memory, such as main memory 606. Common forms of non-transitory media include, for example, a floppy disk, a flexible disk, hard disk, solid state drive, magnetic tape, or any other magnetic data storage medium, a CD-ROM, any other optical data storage medium, any physical medium with patterns of holes, a RAM, a PROM, and EPROM, a FLASH-EPROM, NVRAM, any other memory chip or cartridge, and networked versions of the same.

Non-transitory media is distinct from but may be used in conjunction with transmission media. Transmission media participates in transferring information between non-transitory media. For example, transmission media includes coaxial cables, copper wire and fiber optics, including the wires that comprise bus 602. Transmission media can also take the form of acoustic or light waves, such as those generated during radio-wave and infra-red data communications.

The computer system 600 also includes a communication interface 618 coupled to bus 602. Network interface 618 provides a two-way data communication coupling to one or more network links that are connected to one or more local networks. For example, communication interface 618 may be an integrated services digital network (ISDN) card, cable modem, satellite modem, or a modem to provide a data communication connection to a corresponding type of telephone line. As another example, network interface 618 may be a local area network (LAN) card to provide a data communication connection to a compatible LAN (or WAN component to communicated with a WAN). Wireless links may also be implemented. In any such implementation, network interface 618 sends and receives electrical, electromagnetic or optical signals that carry digital data streams representing various types of information.

A network link typically provides data communication through one or more networks to other data devices. For example, a network link may provide a connection through local network to a host computer or to data equipment operated by an Internet Service Provider (ISP). The ISP in turn provides data communication services through the world wide packet data communication network now commonly referred to as the "Internet." Local network and Internet both use electrical, electromagnetic or optical signals that carry digital data streams. The signals through the various networks and the signals on network link and through communication interface 618, which carry the digital data to and from computer system 600, are example forms of transmission media.

The computer system 600 can send messages and receive data, including program code, through the network(s), network link and communication interface 618. In the Internet example, a server might transmit a requested code for an application program through the Internet, the ISP, the local network and the communication interface 618.

The received code may be executed by processor 604 as it is received, and/or stored in storage device 610, or other non-volatile storage for later execution.

Each of the processes, methods, and algorithms described in the preceding sections may be embodied in, and fully or partially automated by, code components executed by one or more computer systems or computer processors comprising computer hardware. The one or more computer systems or computer processors may also operate to support performance of the relevant operations in a "cloud computing" environment or as a "software as a service" (SaaS). The processes and algorithms may be implemented partially or wholly in application-specific circuitry. The various features and processes described above may be used independently of one another, or may be combined in various ways. Different combinations and sub-combinations are intended to fall within the scope of this disclosure, and certain method or process blocks may be omitted in some implementations. The methods and processes described herein are also not limited to any particular sequence, and the blocks or states relating thereto can be performed in other sequences that are appropriate, or may be performed in parallel, or in some other manner. Blocks or states may be added to or removed from the disclosed example embodiments. The performance of certain of the operations or processes may be distributed among computer systems or computers processors, not only residing within a single machine, but deployed across a number of machines.

As used herein, a circuit might be implemented utilizing any form of hardware, software, or a combination thereof. For example, one or more processors, controllers, ASICs, PLAS, PALs, CPLDs, FPGAs, logical components, software routines or other mechanisms might be implemented to make up a circuit. In implementation, the various circuits described herein might be implemented as discrete circuits or the functions and features described can be shared in part or in total among one or more circuits. Even though various features or elements of functionality may be individually described or claimed as separate circuits, these features and functionality can be shared among one or more common circuits, and such description shall not require or imply that separate circuits are required to implement such features or functionality. Where a circuit is implemented in whole or in part using software, such software can be implemented to operate with a computing or processing system capable of carrying out the functionality described with respect thereto, such as computer system 600.

As used herein, the term "or" may be construed in either an inclusive or exclusive sense. Moreover, the description of resources, operations, or structures in the singular shall not be read to exclude the plural. Conditional language, such as, among others, "can," "could," "might," or "may," unless specifically stated otherwise, or otherwise understood within the context as used, is generally intended to convey that certain embodiments include, while other embodiments do not include, certain features, elements and/or steps.

Terms and phrases used in this document, and variations thereof, unless otherwise expressly stated, should be construed as open ended as opposed to limiting. Adjectives such as "conventional," "traditional," "normal," "standard," "known," and terms of similar meaning should not be construed as limiting the item described to a given time period or to an item available as of a given time, but instead should be read to encompass conventional, traditional, normal, or standard technologies that may be available or known now or at any time in the future. The presence of broadening words and phrases such as "one or more," "at least," "but not limited to" or other like phrases in some instances shall not be read to mean that the narrower case is intended or required in instances where such broadening phrases may be absent.

What is claimed is:

1. A test card, comprising:
a test component comprising logic configured to simulate a test function to test a plurality of socket types; and
an adaptor Printed Circuit Board (PCB) comprising a first surface that is configured to be inserted into a corresponding socket type on a motherboard, wherein the adaptor PCB serves as an interface between the test component and a socket of the corresponding socket type,
wherein the test component is connected to a second surface of the adaptor PCB opposite the socket, and wherein the test component simulates a test function to test the socket.

2. The test card of claim 1, wherein the test component is a Field Gate Programmable Array (FGPA) integrated circuit or a Complex Programmable Logic Device (CPLD) integrated circuit that is programmed with the logic that simulates the test function.

14

3. The test card of claim 2, wherein the FGPA integrated circuit or the CPLD integrated circuit is programmed to act as a dummy CPU module that simulates IEEE 1149.1/6 Boundary Scan capability.

4. The test card of claim 1, wherein the test function is a Universal Boundary Scan (UBS) test.

5. The test card of claim 1, wherein the test function is a Boundary Scan Interconnect (BSI) test.

6. The test card of claim 5, wherein the test component comprises a plurality Joint Test Action Group (JTAG) ports corresponding to JTAG pins of the socket.

7. The test card of claim 1, wherein the adaptor PCB is configured to connect with the corresponding socket type by having a pin configuration that matches with a pin configuration of the corresponding socket type.

8. The test card of claim 7, wherein the test component is configured to simulate the test function by generating scan signals and applying the scan signals to the pin configuration of the adaptor PCB, wherein the adaptor PCB is configured to apply the scan signals to the pin configuration of the corresponding socket type.

9. The test card of claim 7, wherein the test component is configured to simulate the test function by receiving scan signals from the corresponding socket type via the pin configuration of the adaptor PCB connected to the pin configuration of the corresponding socket type.

10. The test card of claim 1, wherein the corresponding socket type is one of a CPU socket type and a GPU socket type.

11. The test card of claim 1, wherein the test component is a universal test component in which the logic is programmed to test a plurality of socket types.

12. The test card of claim 1, wherein the test component is a dummy CPU module that is programmed to simulate IEEE 1149.1/6 Boundary Scan capability.

13. A method, comprising:
connecting a first surface of an adaptor Printed Circuit Board (PCB), corresponding to a socket type of a plurality of socket types, to a socket on a motherboard;
connecting a test component to the socket by connecting the test component to a second surface of the adaptor PCB, wherein the test component comprises logic that simulates a test function to test the plurality of socket types; and
performing the test function to test the socket using the test component connected to the adaptor PCB by executing the logic that simulates the test function.

14. The method of claim 13, wherein the test component is a Field Gate Programmable Array (FGPA) integrated circuit or a Complex Programmable Logic Device (CPLD) integrated circuit that is programmed with the logic that simulates the test function.

15. The method of claim 13, wherein the test function is one of Universal Boundary Scan (UBS) test, a Boundary Scan Interconnect (BSI) test, and IEEE 1149.1/6 Boundary Scan capability.

16. The method of claim 13, wherein the adaptor PCB is configured to connect with the corresponding socket type by having a pin configuration that matches with a pin configuration of the corresponding socket type.

17. The method of claim 13, wherein performing the test function comprises:
generating, by the test component, scan signals;
applying the scan signals to pins of the connected socket via pins of the adaptor PCB connected to the pins of the connected socket; and determining whether each pin of the connected socket pass or fail the test function based on the applied scan signals.

18. The method of claim 13, wherein performing the test function comprises:

receiving, by the test component, scan signals via of pins the adaptor PCB connected to the pins of the connected socket; and determining whether each pin of the connected socket pass or fail the test function based on the received scan signals.

19. The method of claim 13, further comprising programming the logic in the test component to simulate the test function.

20. A central processing unit (CPU) socket test apparatus, comprising:

a test module comprising logic programed to perform a test function on a plurality of CPU socket types; and an adaptor component comprising a first surface and a second surface opposite the first surface, the first surface is configured to be electrically connected to the test module, the second surface comprises a vertical connector that corresponds to a CPU socket type of the plurality of CPU socket types and is configured to serve as an interface between the test module and a CPU socket of the corresponding CPU socket type.

\* \* \* \* \*